United States Patent [19]

Ehrfeld et al.

[11] Patent Number: 4,698,285

[45] Date of Patent: Oct. 6, 1987

[54] METHOD FOR PRODUCING DEEP-ETCH, X-RAY LITHOGRAPHY MASKS

[75] Inventors: Wolfgang Ehrfeld, Karlsruhe; Asim Maner; Dietrich Münchmeyer, both of Stutensee, all of Fed. Rep. of Germany

[73] Assignee: Kernforschungszentrum Karlsruhe GmbH, Karlsruhe, Fed. Rep. of Germany

[21] Appl. No.: 898,081

[22] Filed: Aug. 20, 1986

[30] Foreign Application Priority Data

Aug. 22, 1985 [DE] Fed. Rep. of Germany ....... 3529966

[51] Int. Cl.$^4$ .............................................. G03F 9/00
[52] U.S. Cl. ........................................ 430/5; 430/296; 430/323; 430/324; 430/326; 430/394; 430/942; 430/967; 204/15; 378/34; 378/35
[58] Field of Search .................. 430/5, 296, 323, 324, 430/326, 329, 394, 942, 967, 321; 204/15; 378/34, 35; 250/492.3

[56] References Cited

U.S. PATENT DOCUMENTS

| | | | |
|---|---|---|---|
| 3,447,924 | 6/1969 | Trzyna et al. | 430/323 |
| 4,018,938 | 4/1977 | Feder et al. | 427/43 |
| 4,371,598 | 2/1983 | Medernach | 430/22 |
| 4,401,738 | 8/1983 | Iwamatsu | 430/5 |

FOREIGN PATENT DOCUMENTS 0112509 6/1985 European Pat. Off. .
3338717 5/1985 Fed. Rep. of Germany .

OTHER PUBLICATIONS

J. M. Moran et al, "High Resolution, Steep Profile, Resist Patterns", The Bell System Technical Journal, vol. 58, No. 5, May–Jun. 1979.

*Primary Examiner*—John E. Kittle
*Assistant Examiner*—José G. Dees
*Attorney, Agent, or Firm*—Spencer & Frank

[57] ABSTRACT

A method for producing a mask for deep-etch x-ray lithography in which the mask pattern of a thin-film mask having thin absorber structures is transferred by recopying with soft X-ray radiation to an X-ray resist layer whose layer thickness corresponds to the thickness of the absorber structures of the mask to be subsequently produced. Transfer errors during recopying are avoided by producing the thin-film mask directly on one side of a carrier membrane; applying a positive X-ray resist layer on the other side of the carrier membrane; irradiating the positive X-ray resist layer with approximately parallel X-ray radiation through the thin-film mask to produce irradiated portions in the positive X-ray resist layer; removing the irradiated portions of the positive X-ray resist layer to expose portions of the carrier membrane; electrolytically depositing elements having a high atomic number, e.g., heavy metals, onto the exposed portions of the carrier membrane, removing the remaining resist material and etching away the thin-film mask.

10 Claims, 5 Drawing Figures

METHOD FOR PRODUCING DEEP-ETCH, X-RAY LITHOGRAPHY MASKS

BACKGROUND OF THE INVENTION

1. Field of the Invention

The present invention relates to a method for producing an X-ray lithographic mask and, in particular, to a method for producing a deep-etch X-ray lithographic mask having extremely thick absorber structures for the X-ray lithographic production of microstructures having extremely small lateral dimensions in the micron range and thicknesses of up to several hundred microns, i.e., deep-etch X-ray lithography.

2. Background of the Art

Conventional thin film masks do not produce sufficient contrast for use in deep-etch X-ray lithographic techniques where thick X-ray resist materials having a thickness of up to several hundred microns are employed and require high energy, X-ray radiation having a correspondingly great penetration depth. The absorber structures of thin film masks have a corrspondingly small thickness and are therefore too weakly absorptive to absorb the high energy, X-ray radiation. Lacking sufficient absorption contrast between carrier membrane and absorber structures, the conventional thin film masks are too transparent to X-ray radiation and the resist material sought to be exposed to radiation in a patterned image receives an unacceptable level of irradiation over its entire surface and development is impaired.

German Laid-Open patent application No. 3,338,717 discloses the production of a mask having metal absorber structures which are about 9 to 12 microns thick and are thus suitable for deep etch X-ray lithography. The mask is produced by recopying the pattern of a thin-film mask by means of soft X-rays onto a positive X-ray resist layer provided on a carrier membrane and having a thickness of about 10 to 12 microns, followed by the subsequent steps of developing to provide a resist pattern and to expose portions of the carrier membrane, and electrodepositing metal absorber structures onto the exposed portions of the carrier membrane. This mask has an absorber structure layer thickness which is within the same order of magnitude as that of the positive X-ray resist layer and is about 9 to 12 microns. During the recopying, the thin-film mask and the X-ray resist layer, in the form of a PMMA foil, that is, a metal foil which has been provided with a polymethylmethacrylate layer, are spatially and thus thermally decoupled. Thermal decoupling results in the development of temperature differences between the thin-film mask and the X-ray resist layer during irradiation which may lead to dimensional deviations and thus to transfer errors, particularly when irradiation is performed using an intensive source. Further, manipulation of such a relatively sensitive thin-film mask is difficult.

European Pat. No. 0,112,509 A3 discloses, in connection with the manufacture of a thin-film mask, the placement of an absorber structure having a thickness of about 0.25 micron directly onto a carrier membrane and the production of a second absorber structure, which is a mirror image of the first absorber structure, on the other side of the membrane by X-ray lithography using a photonegative lacquer. However, due to the limited resolution capability characteristic of photonegative lacquers, the second absorber structure has a layer thickness which is limited to about 0.25 micron. The production of masks including absorber structures having a thickness ranging from 9 to 12 microns and up, as required for the above-mentioned deep-etch X-ray lithography, is not disclosed in the reference.

SUMMARY OF THE INVENTION

Based on this state of the art, it is an object of the present invention to provide a method of the recopying type for producing X-ray masks having thick absorber structures in which transfer errors due to temperature differences in the course of recopying are avoided as much as possible.

This and other objects are attained by a method for producing a mask for deep-etch X-Ray lithography, the mask including a mounting frame; a carrier membrane tautly tensioned over the mounting frame and having a first side and a second side, the second side facing the mounting frame, and being substantially transmissive to X-ray radiation; and absorber structures comprised of at least one element having a high atomic number and provided on the second side of the carrier membrane in a mask pattern, which absorber structures strongly absorb X-ray radiation. Thus, transfer errors are substantially avoided by providing a method wherein a thin-film mask is produced on the first side of the carrier membrane, such as by using micro-lithography and thin-film technology. The thin-film mask has absorber structures which absorb X-ray radiation and which are provided in a mask pattern which is complementary to that of the mask for X-ray lithography to be produced. An X-ray resist layer is applied on the second side of the carrier membrane, which X-ray resist layer is composed of a positive resist material and has a thickness which crresponds to that of the absorber structures of the mask for X-ray lithography to be produced. Portions of the X-ray resist layer are irradiated with substantially parallel, X-ray radiation through the thin film mask. The irradiated portions of the X-ray resist layer are removed by dissolving same in a developer to expose portions of the second side of the carrier member. At least one element having a high atomic number is electrolytically deposited onto the exposed portions of the second side of the carrier member and to a thickness of up to that which corresponds to that of the X-ray resist layer, whereby absorber structures are provided for the mask for X-ray lithography to be produced. The non-irradiated portions of the X-ray resist layer are removed with a solvent and the thin-film mask is removed by etching, whereby a mask for deep-etch X-ray lithography is produced. The mask thus includes a mounting frame; a carrier membrane tautly tensioned over the mounting frame; and absorber structures comprised of at least one element having a high atomic number and provided on the side of the carrier membrane which faces the mounting frame in a mask pattern, which absorber structures strongly absorb X-ray radiation.

In a preferred embodiment of the method for producing an X-ray lithographic mask, transfer errors are substantially avoided by providing a method wherein a carrier member is mounted onto a mounting frame under tension, the carrier member being substantially transmissive to X-ray radiation and having a first side and a second side, the second side facing the carrier member. A first metal layer is deposited on the first side of the carrier member and a second metal layer is deposited on the second side of the carrier member, the first and second metal layers being substantially transmissive to X-ray radiation. A thin-film mask is produced on the first metal layer using micro-lithography, the thin-film mask having metal absorber structures which absorb X-ray radiation and which are provided in a mask pattern which is complementary to that of the X-ray lithographic mask to be produced. An X-ray resist layer is applied on the second metal layer, which X-ray resist layer is composed of a positive resist material. Portions of the X-ray resist layer are irradiated with substantially parallel X-ray radiation through the thin-film mask. The irradiated portions of the X-ray resist layer are removed with a developer to expose portions of the second metal layer. At least one heavy metal is electrolytically deposited onto the exposed portions of the second metal layer, whereby absorber structures are provided for the mask for X-ray lithography to be produced. The non-irradiated portions of the X-ray resist layer are removed with a solvent and the thin-film mask is removed by etching. Preferably, the etching step also serves to remove the first metal layer and exposed portions of the second metal layer. Thus, an X-ray lithographic mask is produced having metal absorber structures which are comprised of at least one heavy metal and which are substantially non-transmissive to high energy, X-ray radiation.

In any event, the method may include the further steps of covering the mounting frame and the second metal layer with a protective lacquer prior to the electrolytic deposition step and removing the protective lacquer after the electrolytic deposition step. Covering may be accomplished by any of several techniques, such as dip coating. Removal may be accomplished by any of several techniques, such as by immersion in or spraying with a solvent.

In a preferred micro-lithographic method for producing the thin-film mask, an electron resist layer is applied on the first metal layer. Portions of the electron resist layer are irradiated with electron beam radiation. Irradiated portions of the electron resist layer are removed with a developer to expose portions of the first metal layer. At least one metal is electrolytically deposited onto the exposed portions of the first metal layer. Finally, the non-irradiated portions of the electon resist layer are removed, such as by means of immersion in a solvent.

The thin, primary, thin absorber structures of the thin-film mask can be produced according to methods known in microlithography, for example, by electron beam lithography or by photo-optical lithography, in conjunction with known thin-film technology, for example, vapor deposition, sputtering, electrolytic deposition, dry etching, and liftoff techniques. During recopying with X-ray radiation, the firm bond of the thin, primary absorber structures with the stable carrier membrane assures simultaneously high mechanical stability and excellent trueness to dimension. In particular, no substantial temperature differences can develop between the thin, primary absorber structures and the thick X-ray resist layer.

The absorber structures of the X-ray lithographic mask have a thickness effective to provide an absorption contrast between the substantially transmissive carrier membrane and the substantially non-transmissive absorber structures to permit photolithographic irradiation of an X-ray resist layer having a thickness of up to 500 microns therethrough with high energy, X-ray radiation. Preferably, the absorber structures of the X-ray lithographic mask have lateral dimensions of down to one micron and thicknesses ranging from 5 to 20 microns.

Synchrotron radiation, for example, from an electron synchrotron, is distinguished by being extremely parallel and of high intensity so that it is particularly well suited for the purposes of the present invention. The X-ray radiation used to irradiate portions of the X-ray resist layer is preferably synchrotron radiation having a characteristic wavelength of 2 nanometers.

BRIEF DESCRIPTION OF THE DRAWING

The individual steps of one embodiment of the method according to the present invention will be described below with reference to the drawing which schematically shows, in cross-section, various stages in the production of a deep-etch X-ray lithographic mask, a fragmentary view of which is shown in each of FIGS. 1 through 5.

DESCRIPTION OF THE PREFERRED EMBODIMENTS

Figure 1:
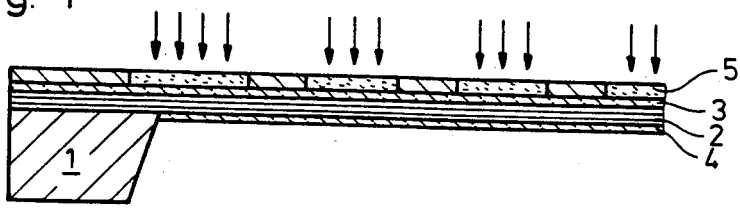
FIG. 1 shows electron beam irradiation of portions of an electron resist layer provided on a first metal layer.

FIG. 1 is a cross-sectional fragmentary view, on a greatly enlarged scale, of a stable mounting frame 1 and a carrier membrane 2 composed of, for example, about 20 microns of beryllium tautly stretched over the mounting frame 1. Onto each side of the carrier membrane 2, a copper layer 3, 4, respectively, having a thickness of about 30 nm, is deposited by sputtered. Copper layers 3, 4 later function as electrodes for the electrolytic deposition steps. An electron resist layer 5 composed of, for example, polybutene sulfone is applied to copper layer 3 by means of spin coating and has a thickness ranging from about 0.3 to 2 microns. This electron resist layer 5 is micro-lithographically structured by irradiating portions thereof with an electron beam stylus and subsequently developing in a developer by, for example, immersing in or spraying with the developer. The developer is, for example, a mixture of 60% methyl ethyl ketone and 40% isopropanol.

Figure 2:
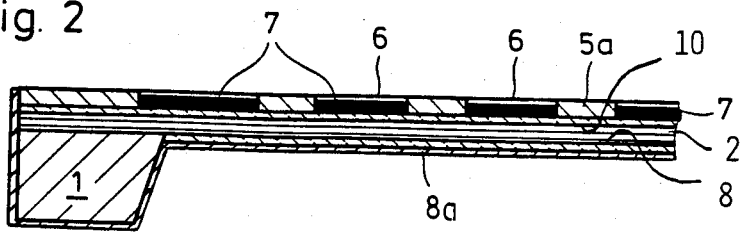
FIG. 2 shows electrolytic deposition of at least one metal onto exposed portions of the first metal layer, which portions were exposed by developing the resist layer.

With reference to FIG. 2, a patterned resist structure results from the developing step which has openings 6 provided through the remaining unexposed resist lyer 5a. Openings 6 expose portions of copper layer 3. Copper is electrolytically deposited onto the exposed portions of copper layer 3, through openings 6 up to the thickness of the resist layer 5a to form the absorber structures 7 of the thin-film mask. The absorber structures thus have a thickness ranging up to from 0.3 to 2 microns. The remaining electron resist layer 5a is then removed, for example, by immersion in or by spraying with a solvent. Several solvents, e.g. xylene, cyclohexanone and dioxane, can be used for stripping the remaining resist layer.

To avoid the electrolytic deposition of copper onto mounting frame 1 and copper layer 4 (or onto underside 8 of carrier membrane 2 for embodiments in which no copper layer 4 is provided), these regions may be initially covered in a any of several known manners with a protective lacquer, which is subsequently removed. Thus, FIG. 2 shows mounting frame 1 and copper layer 4 covered with protective lacquer 8a provided by, for example, flow coating. Removal of protective lacquer 8a may be accomplished by immersing in or by spraying with a suitable solvent. A conventional photoresist of th AZ 1300 series (Kalle, Germany) may be used as a protective lacquer. It is dissolved by ethoxyethyl acetate or a commercially available AZ thinner.

Figure 3:
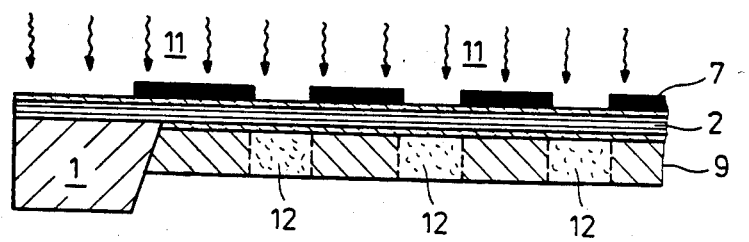
FIG. 3 shows the finished thin-film mask, after removal of the remaining resist layer, being used as a mask for recopying its mask pattern by irradiation of a positive X-ray resist layer provided on a second metal layer on the opposite side of the carrier membrane using synchrotron radiation.

According to FIG. 3, a layer 9 of about 12 microns of positive X-ray resist material is then applied to underside 8 of carrier membrane 2, such as by in situ polymerization of polymethylmethacrylate (PMMA) and is irradiated from upper side 10 of the carrier membrane 2, on which absorber structures 7 of the thin-film mask are disposed. Irradiation is accomplished with synchrotron radiation 11 having a characteristic wavelength of 2 nm. The irradiated regions 12 of positive X-ray resist layer 9 which were not shielded by the absorber structures 7 of the thin-film mask are then removed in a developer bath thereby exposing portions of copper layer 4. The developer for PMMA may be a mixture of 20% tetrahydro-1,4-oxazine, 5% monoethanol amine, 10% water, and 65% diethylene glycol monobutyl ether.

Figure 4:
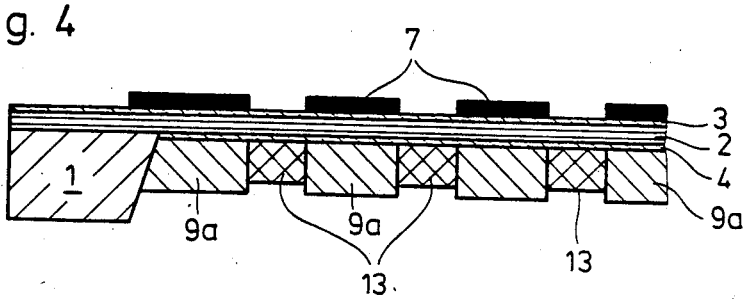
FIG. 4 shows electrolytic deposition of at least one heavy metal onto exposed portions of the second metal layer, which portions were exposed by developing the X-ray resist layer.

With reference to FIG. 4, copper layer 4 is used as an electrode for the electrolytic deposition of gold onto the exjposed portions thereof. Gold is deposited to form 10 micron thick absorber structures 13 having a mask pattern which is complementary to that of the absorber structures 7 of the thin-film mask.

Figure 5:
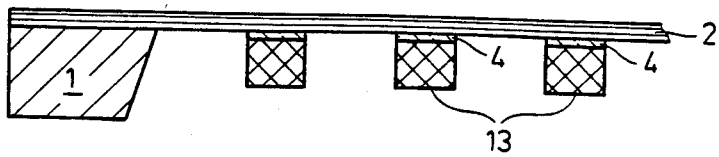
FIG. 5 shows the finished deep-etch X-ray lithographic mask after the remaining X-ray resist layer has been removed and after the thin-film mask, the first metal layer, and exposed portions of the second metal layer have been removed by etching.

As shown in FIG. 5, the non-exposed portions 9a of X-ray resist layer 9 are removed by, for example, irradiation and subsequent immersion in a suitable solvent or stripper. Dichloromethane as well as the PMMA developer described above are suitable solvents.

Primary absorber structures 7, copper layer 3 and copper layer 4 are then etched away, to the extent that they are not protected by the gold absorber structures 13, such as by contacting same with nitric acid. In this way, a deep-etch X-ray lithography mask is produced which is composed of a stable mounting frame 1, a carrier membrane 2 which is substantially transmissive to, i.e., at most only weakly absorbs, X-ray radiation and the thick metal absorber structures 13.

If there are special demands for accuracy in the structural positioning of the absorber structures, the primary absorber structure must have a high structural accuracy and better absorption contrast than can customarily be realized with electron beam lithography or with other lithographic methods. In such a case, a tri-level resist system is advisably employed instead of the electron resist 5. Such a tri-level resist system is described, for example, by J. M. Moran and D. Maydan in "High Resolution, Steep Profile Resist Patterns", Bell Syst. Techn. J., Volume 58 (5), May–June 1979, page 1027.

The present disclosure relates to the subject matter disclosed in German Patent Application No. 35 29 966.5, filed Aug. 22nd, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A method for producing a mask for deep-etch X-Ray lithography, the mask including a mounting frame; a carrier membrane tautly tensioned over the mounting frame and having a first side and a second side, the second side facing the mounting frame, and being substantially transmissive to X-ray radiation; and absorber structures comprised of at least one element having a high atomic number and provided on the second side of the carrier membrane in a mask pattern, which absorber structures strongly absorb X-ray radiation, the method comprising:
   a. producing a thin-film mask on the first side of the carrier membrane, the thin-film mask having absorber structures which absorb X-ray radiation and which are provided in a mask pattern which is complementary to that of the mask for X-ray lithography to be produced;
   b. applying an X-ray resist layer on the second side of the carrier membrane, which X-ray resist layer is comprised of a positive resist material and has a thickness which corresponds to that of the absorber structures of the mask for X-ray lithography to be produced;
   c. irradiating portions of the X-ray resist layer with substantially parallel, X-ray radiation through the thin film mask;
   d. removing the irradiated portions of the X-ray resist layer by dissolving same in a developer to expose portions of the second side of the carrier member;
   e. electrolytically depositing at least one element having a high atomic number onto the exposed portions of the second side of the carrier member and to a thickness of up to that which corresponds to that of the X-ray resist layer, whereby absorber structures are provided for the mask for X-ray lithography to be produced;
   f. removing the non-irradiated portions of the X-ray resist layer; and
   g. removing the thin-film mask by etching, whereby a mask for deep-etch X-ray lithography is produced.

2. The method according to claim 1, wherein synchrotron radiation is employed as the substantially parallel, X-ray radiation for irradiating the X-ray resist layer.

3. A method for producing an X-ray lithographic mask, comprising:
   a. mounting a carrier member onto a mounting frame under tension, the carrier member being substantially transmissive to X-ray radiation and having a first side and a second side, the second side facing the carrier member;
   b. depositing a first metal layer on the first side of the carrier member and a second metal layer on the second side of the carrier member, the first and second metal layers being substantially transmissive to X-ray radiation;
   c. producing a thin-film mask on the first metal layer using micro-lithography, the thin-film mask having metal absorber structures which absorb X-ray radiation and which are provided in a mask pattern which is complementary to that of the X-ray lithographic mask to be produced;

d. applying an X-ray resist layer on the second metal layer, which X-ray resist layer is comprised of a positive resist material;

e. irradiating portions of the X-ray resist layer with substantially parallel X-ray radiation through the thin-film mask;

f. removing the irradiated portions of the X-ray resist layer with a developer to expose portions of the second metal layer;

g. electrolytically depositing at least one heavy metal onto the exposed portions of the second metal layer, whereby absorber structures are provided for the mask for X-ray lithography to be produced;

h. removing the non-irradiated portions of the X-ray resist layer with a solvent; and i. removing the thin-film mask by etching, whereby an X-ray lithographic mask is produced having metal absorber structures which are comprised of at least one heavy metal and which are substantially non-transmissive to high energy, X-ray radiation.

4. The method according to claim 3, wherein the thin-film mask is produced by a micro-lithographic method comprising:

a. applying an electron resist layer on the first metal layer;

b. irradiating portions of the electron resist layer with electron beam radiation;

c. removing irradiated portions of the electron resist layer with a developer to expose portions of the first metal layer;

d. electrolytically depositing at least one metal onto the exposed portions of the first metal layer; and e. removing the non-irradiated portions of the electron resist layer.

5. The method according to claim 3, including the further steps of covering the mounting frame and the second metal layer with a protective lacquer prior to the electrolytic deposition step and removing the protective lacquer after the electrolytic deposition step.

6. The method according to claim 3, wherein the step of removing the thin-film mask by etching also serves to remove the first metal layer and exposed portions of the second metal layer.

7. The method according to claim 3, wherein the X-ray radiation used to irradiate portions of the X-ray resist layer is synchrotron radiation.

8. The method according to claim 3, wherein the absorber structures of the X-ray lithographic mask have a thickness effective to provide an absorption contrast between the substantially transmissive carrier membrane and the substantially non-transmissive absorber structures to permit photolithographic irradiation of an X-ray resist layer having a thickness of up to 500 microns therethrough with high energy, X-ray radiation.

9. The method according to claim 3, wherein the absorber structures of the X-ray lithographic mask have thicknesses ranging from 5 to 20 microns.

10. The method according to claim 9, wherein the absorber structures of the X-ray lithographic mask have lateral dimensions of down to one micron.

* * * * *